US012690405B2

(12) United States Patent
    Patil

(10) Patent No.: US 12,690,405 B2
(45) Date of Patent: Jul. 21, 2026

(54) PURGE SYSTEM TO CLEAN WAFER BACKSIDE FOR RING SUSCEPTOR

(71) Applicant: Applied Materials, Inc., Santa Clara, CA (US)

(72) Inventor: Aniketnitin Patil, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 114 days.

(21) Appl. No.: 18/418,867

(22) Filed: Jan. 22, 2024

(65) Prior Publication Data

US 2024/0258097 A1     Aug. 1, 2024

Related U.S. Application Data

(60) Provisional application No. 63/441,385, filed on Jan. 26, 2023.

(51) Int. Cl.
    H10P 70/00      (2026.01)
    B08B 5/00       (2006.01)
    H10P 72/00      (2026.01)

(52) U.S. Cl.
    CPC .............. H10P 70/56 (2026.01); B08B 5/00 (2013.01); H10P 72/0402 (2026.01)

(58) Field of Classification Search
    CPC ........... H01L 21/0209; H01L 21/67017; H01L 21/68792; H01L 21/68771; H01L 21/6719; H01L 21/67196; H01L 21/67201; H01L 21/67173; H01L 21/67184; H01L 21/6776; H01L 21/67161; H01L 21/67155; H01L 21/67069; H01L 21/67748; H01L 21/67751; H01L 21/67745; B08B 5/00; C30B 25/12; C30B 25/14; C23C 16/54;
    (Continued)

(56) References Cited

U.S. PATENT DOCUMENTS

| 6,170,433 B1 | 1/2001 | Du Bois |
| 6,786,996 B2 | 9/2004 | Emami |

(Continued)

FOREIGN PATENT DOCUMENTS

| CN | 111725114 A | 9/2020 |
| CN | 113990780 A | 1/2022 |

(Continued)

OTHER PUBLICATIONS

International Search Report and Written Opinion dated Feb. 7, 2024 for Application No. PCT/US2023/035453.
(Continued)

*Primary Examiner* — Rudy Zervigon
(74) *Attorney, Agent, or Firm* — Patterson + Sheridan, LLP

(57)          ABSTRACT

A method and apparatus for processing substrates applicable for use in semiconductor manufacturing. The method includes rotating a first shaft having a first perforation where at least a part of the first shaft is disposed within a second shaft. The method further includes flowing a gas through a piping, where the piping is coupled to a second perforation in the second shaft. The method also includes flowing the gas through the second perforation and the first perforation into an interior of the first shaft. The method further includes flowing the gas from the interior of the first shaft to an underside of a substrate disposed within a processing chamber.

20 Claims, 7 Drawing Sheets

(58) Field of Classification Search
CPC ............ C23C 16/45551; C23C 16/545; C23C 16/4412; C23C 14/568; C23C 16/4401
USPC ........... 118/715, 719, 728, 500; 156/345.33, 156/345.34, 345.31, 345.32, 345.51; 361/234; 414/941
See application file for complete search history.

(56) References Cited

U.S. PATENT DOCUMENTS

| | | | |
|---|---|---|---|
| 8,673,081 B2 | 3/2014 | Sivaramakrishnan et al. | |
| 9,570,330 B2 | 2/2017 | Hofmeister et al. | |
| 9,620,395 B2 | 4/2017 | Yang et al. | |
| 9,640,416 B2 | 5/2017 | Arai | |
| 9,871,350 B2 | 1/2018 | McLaurin et al. | |
| 9,875,895 B2 | 1/2018 | Yang et al. | |
| 10,161,036 B2 | 12/2018 | Hyon et al. | |
| 10,392,702 B2 | 8/2019 | Jung et al. | |
| 10,741,396 B2 | 8/2020 | Jung et al. | |
| 10,755,955 B2 | 8/2020 | Ishii et al. | |
| 10,770,336 B2 | 9/2020 | Hill et al. | |
| 10,870,922 B2 | 12/2020 | Konkola et al. | |
| 10,903,625 B2 | 1/2021 | McLaurin et al. | |
| 11,111,580 B2 | 9/2021 | Kang et al. | |
| 11,117,265 B2 | 9/2021 | Wirth et al. | |
| 11,335,587 B2 | 5/2022 | Ota et al. | |
| 2004/0035358 A1* | 2/2004 | Basceri ............ | C23C 16/45514 427/248.1 |
| 2008/0286981 A1* | 11/2008 | Hasper ................... | C23C 16/34 118/704 |
| 2012/0161405 A1* | 6/2012 | Mohn ................... | C23C 16/401 279/142 |
| 2015/0056787 A1 | 2/2015 | Brenninger | |
| 2016/0333478 A1* | 11/2016 | Tatsuoka ........... | C23C 16/45574 |
| 2018/0315626 A1 | 11/2018 | Franklin | |
| 2019/0311938 A1 | 10/2019 | Chen et al. | |
| 2021/0028075 A1 | 1/2021 | Zhu et al. | |
| 2021/0324514 A1 | 10/2021 | Ye et al. | |
| 2022/0002873 A1* | 1/2022 | Nonomura ........ | C23C 16/45502 |
| 2022/0121196 A1 | 4/2022 | Omori | |
| 2022/0162751 A1 | 5/2022 | Haanstra et al. | |
| 2022/0170156 A1 | 6/2022 | Jdira et al. | |
| 2022/0181193 A1 | 6/2022 | Gao et al. | |
| 2022/0189804 A1 | 6/2022 | Luan et al. | |
| 2022/0199444 A1 | 6/2022 | Oosterlaken et al. | |
| 2022/0254668 A1 | 8/2022 | Oosterlaken et al. | |
| 2022/0268520 A1 | 8/2022 | Oosterlaken et al. | |
| 2022/0298643 A1 | 9/2022 | Kajbafvala et al. | |
| 2022/0298672 A1 | 9/2022 | M'Saad et al. | |
| 2022/0301829 A1 | 9/2022 | Yoshikawa | |
| 2022/0301905 A1 | 9/2022 | Ye et al. | |
| 2022/0301906 A1 | 9/2022 | Naik et al. | |
| 2022/0352006 A1 | 11/2022 | Huang et al. | |
| 2022/0359246 A1 | 11/2022 | Umeoka | |
| 2023/0163019 A1* | 5/2023 | Hill ..................... | H10P 72/7612 216/58 |
| 2024/0018658 A1* | 1/2024 | Zhu ................... | C23C 16/45591 |
| 2024/0141498 A1* | 5/2024 | Zhu .......................... | C23C 16/52 |
| 2024/0198468 A1* | 6/2024 | Patil ..................... | C30B 35/005 |
| 2024/0254624 A1* | 8/2024 | Moradian ......... | C23C 16/45502 |
| 2024/0254627 A1* | 8/2024 | Dhamodharan .. | C23C 16/45563 |
| 2025/0038040 A1* | 1/2025 | Moradian .......... | H10P 72/7614 |
| 2025/0305141 A1* | 10/2025 | Pandey .............. | C23C 16/4581 |

FOREIGN PATENT DOCUMENTS

| | | |
|---|---|---|
| CN | 111893567 B | 2/2022 |
| CN | 114000192 A | 2/2022 |
| CN | 111254487 B | 3/2022 |
| CN | 114138030 A | 3/2022 |
| CN | 114158145 A | 3/2022 |
| CN | 114351249 A | 4/2022 |
| CN | 216357351 U | 4/2022 |
| CN | 110854044 B | 5/2022 |
| CN | 111235551 B | 5/2022 |
| CN | 114481311 A | 5/2022 |
| CN | 114540947 A | 5/2022 |
| CN | 114540948 A | 5/2022 |
| CN | 114551331 A | 5/2022 |
| CN | 114613703 A | 6/2022 |
| CN | 114743924 A | 7/2022 |
| CN | 114823428 A | 7/2022 |
| CN | 114855272 A | 8/2022 |
| CN | 114883221 A | 8/2022 |
| CN | 114914181 A | 8/2022 |
| CN | 114927450 A | 8/2022 |
| CN | 115020281 A | 9/2022 |
| CN | 115101432 A | 9/2022 |
| CN | 115101443 A | 9/2022 |
| CN | 115101470 A | 9/2022 |
| CN | 115233303 A | 10/2022 |
| CN | 115235257 A | 10/2022 |
| CN | 115274510 A | 11/2022 |
| CN | 115312432 A | 11/2022 |
| CN | 115404543 A | 11/2022 |
| JP | 2009147148 A | 7/2009 |
| KR | 10-2003-0074392 A | 9/2003 |
| KR | 20080081823 A | 9/2008 |
| KR | 10-2016-0106598 A | 9/2016 |

OTHER PUBLICATIONS

International Search Report and Written Opinion dated May 21, 2024 for Application No. PCT/US2024/012373.
Office Action from South Korean Application No. 10-2025-7027941 dated Jan. 20, 2026.

* cited by examiner

500

PURGE SYSTEM TO CLEAN WAFER BACKSIDE FOR RING SUSCEPTOR

CROSS-REFERENCE TO RELATED APPLICATIONS

This application claims priority to U.S. Provisional Patent Application Ser. No. 63/441,385 filed on Jan. 26, 2023, which is herein incorporated by reference in its entirety.

BACKGROUND

Field

Embodiments described herein generally relate to an apparatus and method of introducing gasses into processing chambers, and related apparatus and methods for introducing cleaning gas to prevent buildup on the backside of substrates.

Description of the Related Art

Semiconductor substrates are processed for a wide variety of applications, including the fabrication of integrated devices and micro-devices. One method of processing substrates includes depositing a material, such as a dielectric material or a semiconductive material, on an upper surface of the substrate. The material may be deposited in a lateral flow chamber by flowing a process gas parallel to the surface of a substrate positioned on a support, and thermally decomposing the process gas to deposit a material from the gas onto the substrate surface. However, operations (such as epitaxial deposition operations) can be long, expensive, and inefficient, and can have limited capacity and throughput. Moreover, hardware can involve relatively large dimensions that occupy higher footprints in manufacturing facilities.

Therefore, a need exists for improved apparatuses and methods in semiconductor processing.

SUMMARY

Embodiments described herein generally relate to an apparatus and method of introducing gasses into processing chambers, and related apparatus and methods for introducing cleaning gas to prevent buildup on the backside of substrates.

In at least one aspect, an apparatus applicable for use in semiconductor manufacturing is provided. The apparatus includes a first shaft having a first perforation. The apparatus further includes a second shaft having a second perforation, and at least a portion of the first shaft is disposed inside of the second shaft and the first shaft is rotatable with respect to the second shaft. The apparatus also includes a support frame coupled to an end of the first shaft. The apparatus further includes a cassette disposed above the support frame. The first perforation and the second perforation are configured to allow passage of a gas through the first perforation and the second perforation when the first shaft is rotated. The first shaft is configured such that the gas is flowable through an interior of the first shaft to contact an underside of a substrate disposed on the cassette.

In another aspect, a method of processing substrates applicable for use in semiconductor manufacturing is provided. The method includes rotating a first shaft having a first perforation and at least a part of the first shaft is disposed within a second shaft. The method further includes flowing a gas through a piping, and the piping is coupled to a second perforation in the second shaft. The method also includes flowing the gas through the second perforation and the first perforation into an interior of the first shaft. The method further includes flowing the gas from the interior of the first shaft to an underside of a substrate disposed within a processing chamber.

In yet another aspect, a method of processing substrates applicable for use in semiconductor manufacturing is provided. The method includes heating a substrate positioned above a substrate support. The method further includes flowing one or more process gases over the substrate to form one or more layers on the substrate. The method also includes rotating a first shaft having a first perforation where at least a part of the first shaft is disposed within a second shaft. The method includes flowing a cleaning gas through a connection, where the connection is coupled to a second perforation in the second shaft. The method also includes flowing the cleaning gas through the second perforation and the first perforation into an interior of the first shaft. The method further includes flowing the cleaning gas from the interior of the first shaft to an underside of a substrate disposed within a processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments described herein generally relate to an apparatus and method of introducing gasses into processing chambers, and related apparatus and methods for introducing cleaning gas to prevent buildup on the backside of substrates.

Epitaxial deposition processes may process a single substrate or multiple substrates at a time. Processing a single substrate may be an inefficient use of operating time, or may take up a large footprint in a manufacturing environment. One method of processing multiple substrates utilizes a stacked substrate configuration. In a stacked substrate configuration, a substrate cassette is positioned inside of a processing chamber. The processing chamber has an upper lamp configuration and a lower lamp configuration to aid in deposition of process gases onto the substrates. In this stacked configuration, the underside of the substrates are exposed to facilitate heat transfer from the lower lamp configuration. However, exposing the underside of the substrates to the process gases may result in deposition on the underside of the lowermost substrate. Deposition on the underside of the lowermost substrate can interfere with lamp heating of the substrate. Thus, there is a need for an improved method of reducing deposition on the underside of the lowermost substrate.

Described herein are an apparatus and method for injecting a gas into a processing chamber to remove the deposition on the lowermost substrate. In at least one embodiment, an apparatus and method for direct injection of one or more cleaning gases on an exposed backside of a substrate positioned on a ring susceptor is provided. The one or more cleaning gases may be flown through a shaft, for example, a cassette shaft or support shaft, supporting the substrate, and injected from the top of the support shaft directly onto the backside of the substrate. Direct injection of the one or more cleaning gases from the support shaft onto the backside of the substrate prevents or reduces deposition from process gases on the backside of the substrate, which may allow for improved heating of the substrate via the backside. In addition, the proximity of the direct injection of cleaning gases from the shaft allows for delivery of an increased concentration of the one or more cleaning gases onto the backside of the substrate then is typical of cleaning gases delivered from other areas of the processing chamber.

Figure 1A:
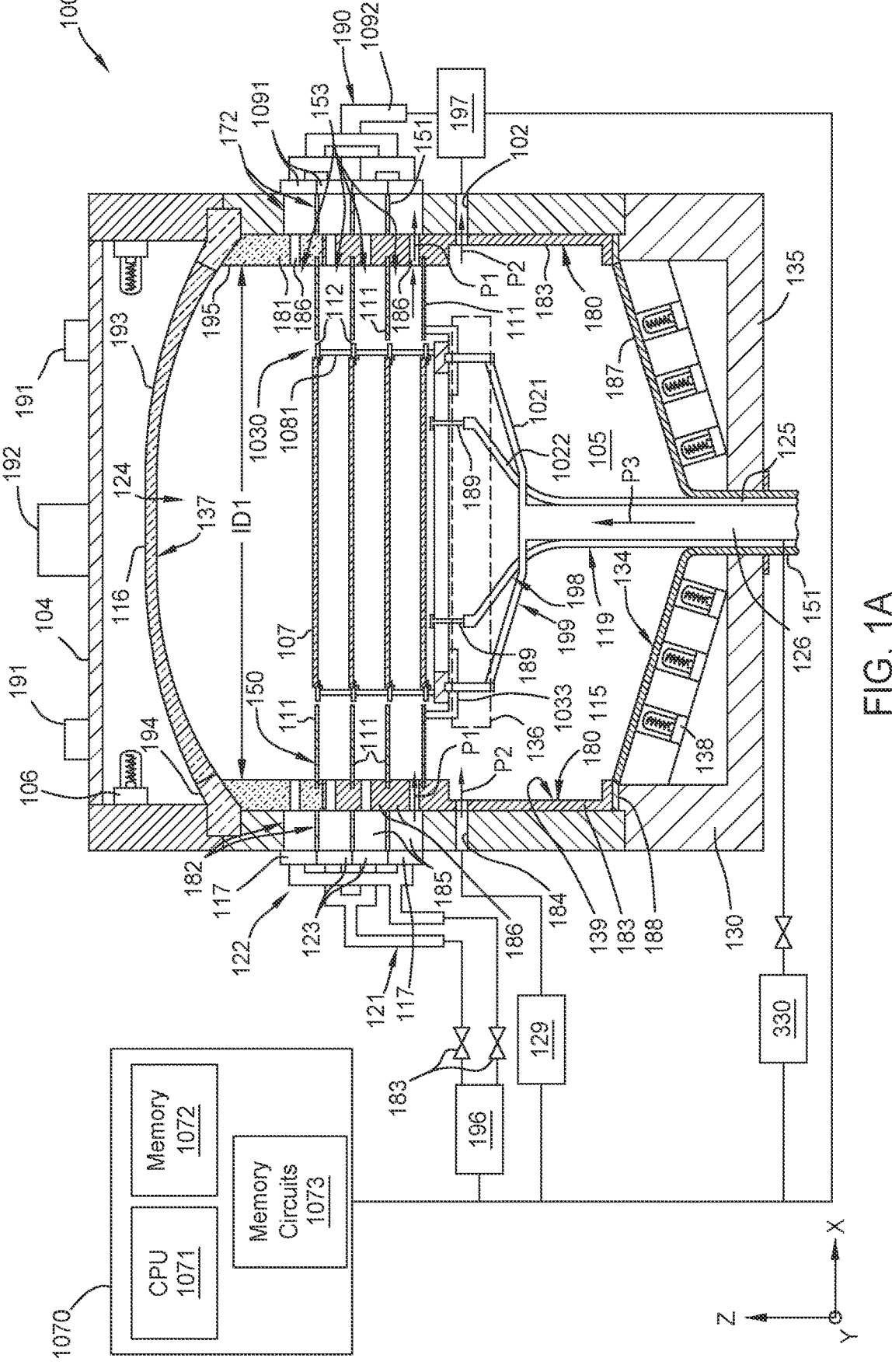
FIG. 1A is a schematic cross-sectional side view of a processing apparatus, according to one embodiment.
Figure 1B:
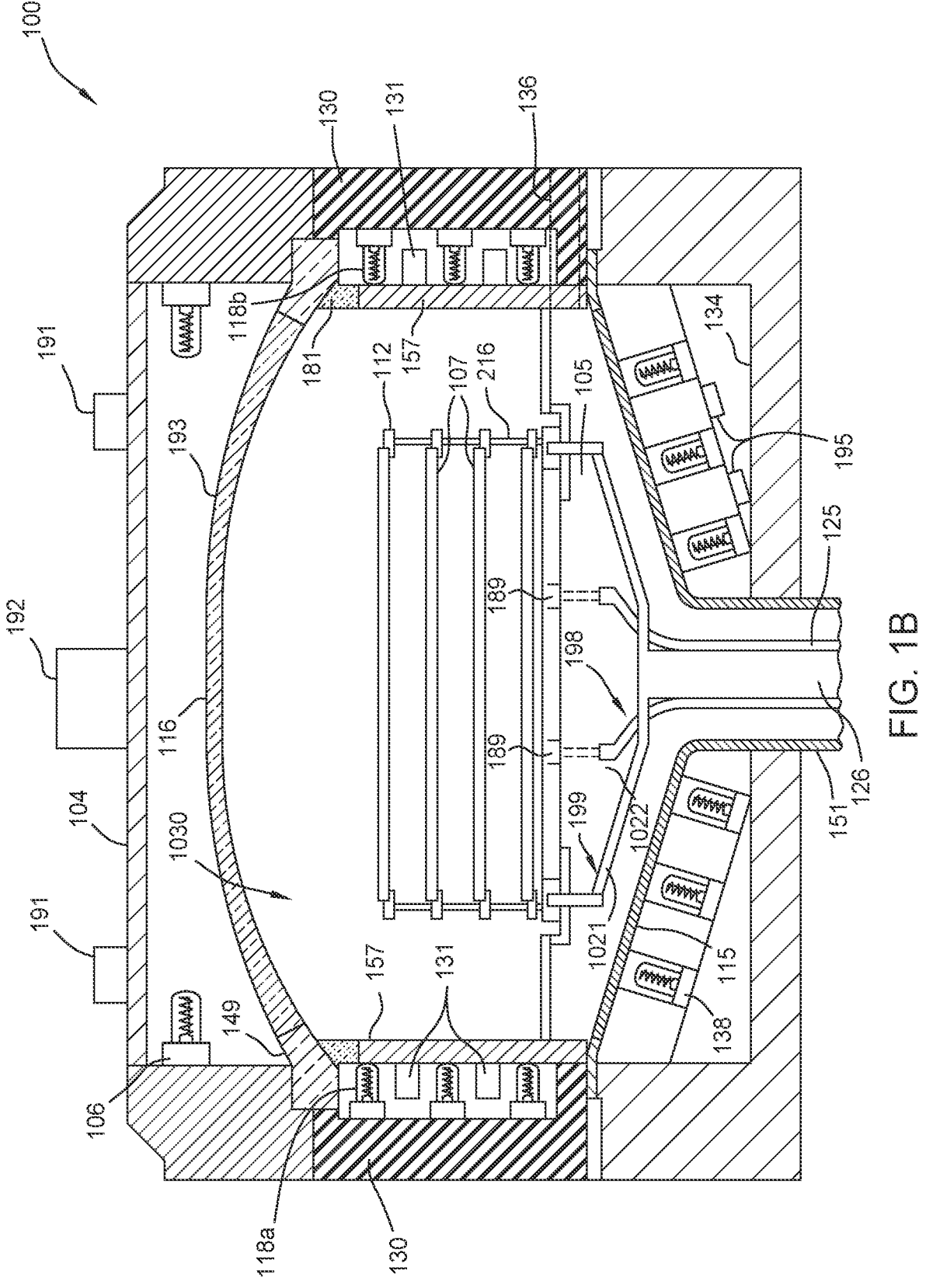
FIG. 1B is a schematic cross-sectional side view of the processing apparatus shown in FIG. 1A, according to one embodiment.

FIG. 1A is a schematic cross-sectional side view of a processing apparatus 100, according to one embodiment. The processing apparatus 100 include a lift assembly 200 configured to supply a cleaning gas to the backside of a substrate. The side heat sources 118a, 118b shown in FIG. 1B are not shown in FIG. 1A for visual clarity purposes. The processing apparatus 100 includes a processing chamber having a chamber body 130 that defines a processing volume 124.

A cassette 1030 is positioned in the processing volume 124 and at least partially supported by a substrate support assembly 119 (such as a pedestal assembly). The cassette 1030 is positioned inwardly of the first shield plate 161. The cassette 1030 includes a plurality of levels that support a plurality of substrates 107 for simultaneous processing (e.g., epitaxial deposition). In the embodiment shown in FIG. 1A, the cassette 1030 supports four substrates 107. The cassette 1030 can support other numbers of substrates, including but not limited to two substrates 107, three substrates 107, six substrates 107, or eight substrates 107. In one or more embodiments, the cassette 1030 supports two substrates 107 or three substrates 107.

The processing apparatus 100 includes an upper window 116, such as a dome, disposed between a lid 104 and the processing volume 124. The processing apparatus 100 includes a lower window 115 disposed below the processing volume 124. One or more upper heat sources 106 are positioned above the processing volume 124 and the upper window 116. The one or more upper heat sources 106 can be radiant heat sources such as lamps, for example halogen lamps. The one or more upper heat sources 106 are disposed between the upper window 116 and the lid 104. The upper heat sources 106 are positioned to provide uniform heating of the substrates 107. One or more lower heat sources 138 are positioned below the processing volume 124 and the lower window 115. The one or more lower heat sources 138 can be radiant heat sources such as lamps, for example halogen lamps. The lower heat sources 138 are disposed between the lower window 115 and a floor 134 of the processing volume 124. The lower heat sources 138 are positioned to provide uniform heating of the substrates 107.

The present disclosure contemplates that other heat sources may be used (in addition to or in place of the lamps) for the various heat sources described herein. For example, resistive heaters, light emitting diodes (LEDs), and/or lasers may be used for the various heat sources described herein.

The upper and lower windows 116, 115 may be transparent to the infrared radiation, such as by transmitting at least 80% (such as at least 95%) of infrared radiation. The upper and lower windows 116, 115 may be a quartz material (such as a transparent quartz). In one or more embodiments, the upper window 116 includes an inner window 193 and outer window supports 194. The inner window 193 may be a thin quartz window that partially defines the processing volume 124. The outer window 194 supports the inner window 193 and are at least partially disposed within a support groove. In one or more embodiments, the lower window 115 includes an inner window 187 and outer window supports 188. The inner window 187 may be a thin quartz window that partially defines the processing volume 124. The outer window supports 188 support the inner window 187.

The substrate support assembly 119 is disposed in the processing volume 124. One or more liners 120 are disposed in the processing volume 124 and surround the substrate support assembly 119. The one or more liners 120 facilitate shielding the chamber body 130 from processing chemistry in the processing volume 124. The chamber body 130 is disposed at least partially between the upper window 116 and the lower window 115. The one or more liners 120 are disposed between the processing volume 124 and the chamber body 130.

The processing apparatus 100 includes a plurality of gas inject passages 182 formed in the chamber body 130 and in fluid communication with the processing volume 124, and one or more gas exhaust passages 172 (a plurality is shown in FIG. 1A) formed in the chamber body 130 opposite the plurality of gas inject passages 182. The one or more gas exhaust passages 172 are in fluid communication with the processing volume 124. Each of the plurality of gas inject passages 182 and one or more gas exhaust passages 172 are formed through one or more sidewalls of the chamber body 130 and through one or more liners 120 that line the one or more sidewalls of the chamber body 130.

Each gas inject passage 182 includes a gas channel 185 formed in the chamber body 130 and one or more gas openings 186 (two and three are shown in FIG. 1A) formed in the one or more liners 120. One or more supply conduit systems are in fluid communication with the gas inject passages 182. In FIG. 1A, an inner supply conduit system 121 and an outer supply conduit system 122 are in fluid communication with the gas inject passages 182. The inner supply conduit system 121 includes a plurality of inner gas boxes 123 mounted to the chamber body 130 and in fluid communication with an inner set of the gas inject passages 182. The outer supply conduit system 122 includes a plurality of outer gas boxes 117 mounted to the chamber body 130 and in fluid communication with an outer set of the gas inject passages 182. The present disclosure contemplates that a variety of gas supply systems (e.g., supply conduit system(s), gas inject passages, and/or gas boxes different than what is shown in FIG. 1A) may be used.

The processing apparatus 100 includes a flow guide structure 150 positioned in the processing volume 124. The flow guide structure 150 divides the processing volume into a plurality of flow levels 153 (four flow levels are shown in FIG. 1A). In one or more embodiments, the flow guide structure 150 includes at least three flow levels 153 and a plurality of flow sections 154 (two flow sections 154 are shown for each flow level 153 in FIG. 1A). The plurality of gas inject passages are 182 positioned as a plurality of inject levels such that each gas inject passage 182 corresponds to one of the plurality of inject levels. Each inject level aligns with a respective flow level 153. The processing apparatus 100 includes a heat shield structure 1060 positioned in the processing volume 124. The heat shield structure 1060 includes a first shield plate 161 and a second shield plate 1062.

The flow guide structure 150 includes a plurality of divider inlet openings 155 and a plurality of divider outlet openings 156 formed therein. The divider outlet openings 156 are opposite of the divider inlet openings 155. The heat shield structure 1060 includes a plurality of shield inlet openings 165 and a plurality of shield outlet openings 166 formed therein. The flow guide structure 150 and/or the heat shield structure 1060 are formed of one or more of quartz (such as transparent quartz, e.g. clear quartz, or opaque quartz, e.g. black quartz), silicon carbide (SiC), or graphite coated with SiC.

The cassette 1030 is positioned inwardly of the first shield plate 161. A pre-heat ring 111 is positioned outwardly of the cassette 1030. The pre-heat ring 111 is coupled to and/or at least partially supported by the one or more liners 120. Portions of the flow guide structure 150 may act as a pre-heat ring for all flow sections 154 of each flow level 153. The pre-heat ring 111 may be part of (such as integrated with) the flow guide structure 150.

As described below, the present disclosure contemplates that the flow guide structure 150 and/or the heat shield structure 1060 can be omitted.

During operations (such as during an epitaxial deposition operation), one or more process gases P1 are supplied to the processing volume 124 through the inner supply conduit system 121 and the outer supply conduit system 122, and through the plurality of gas inject passages 182. The one or more process gases P1 are supplied from one or more gas sources 196 in fluid communication with the plurality of gas inject passages 182. Each of the gas inject passages 182 is configured to direct the one or more processing gases P1 in a generally radially inward direction towards the cassette 1030. As such, in one or more embodiments, the gas inject passages 182 may be part of a cross-flow gas injector. The flow(s) of the one or more process gases P1 can be divided into a plurality of flow levels 153.

The processing apparatus 100 includes an exhaust conduit system 190. The one or more process gases P1 can be exhausted through exhaust gas openings formed in the one or more liners 120, exhaust gas channels formed in the chamber body 130, and then through exhaust gas boxes 1091. The one or more process gases P1 can flow from exhaust gas boxes 1091 and to an optional common exhaust box 1092, and then out through a conduit using one or more pump devices 197 (such as one or more vacuum pumps).

The one or more processing gases P1 can include, for example, purge gases, cleaning gases, and/or deposition gases. The deposition gases can include, for example, one or more reactive gases carried in one or more carrier gases. The one or more reactive gases can include, for example, silicon and/or germanium containing gases (such as silane ($SiH_4$), disilane ($Si_2H_6$), dichlorosilane ($SiH_2Cl_2$), and/or germane ($GeH_4$)), chlorine containing etching gases (such as hydrogen chloride (HCl)), and/or dopant gases (such as phosphine ($PH_3$) and/or diborane ($B_2H_6$)). The one or more purge gases can include, for example, one or more of argon (Ar), helium (He), nitrogen ($N_2$), hydrogen chloride (HCl), and/or hydrogen ($H_2$).

Purge gas P2 supplied from a purge gas source 129 is introduced to the bottom region 105 of the processing volume 124 through one or more purge gas inlets 184 formed in the sidewall of the chamber body 130.

The one or more purge gas inlets 184 are disposed at an elevation below the gas inject passages 182. If the one or more liners 120 are used, a section of the one or more liners 120 may be disposed between the gas inject passages 182 and the one or more purge gas inlets 184. The one or more purge gas inlets 184 are configured to direct the purge gas P2 in a generally radially inward direction. The one or more purge gas inlets 184 may be configured to direct the purge gas P2 in an upward direction. During a film formation process, the substrate support assembly 119 is located at a position that can facilitate the purge gas P2 to flow generally along a flow path across a back side of the cassette 1030. The purge gas P2 exits the bottom region 105 and is exhausted out of the processing apparatus 100 through one or more purge gas exhaust passages 102 located on the opposite side of the processing volume 124 relative to the one or more purge gas inlets 184.

One or more cleaning gas(es) P3 are supplied from a lift assembly gas source 330 and introduced from the lift assembly 200 to the underside of the cassette 1030. The cleaning gas P3 is shown in more detail in FIG. 2 and FIGS. 3A-3B.

The substrate support assembly 119 includes a first support frame 199 and a second support frame 198 disposed at least partially about the first support frame 199. The first support frame 199 includes arms coupled to the cassette 1030 such that lifting and lowering the first support frame 199 lifts and lowers the cassette 1030. A plurality of lift pins 189 are suspended from the cassette 1030. Lowering of the cassette 1030 and/or lifting of the second support frame 198 initiates contact of the lift pins 189 with arms of the second support frame 198. Continued lowering of the cassette 1030 and/or lifting of the second support frame 198 initiates contact of the lift pins 189 with the substrates in the cassette 1030 such that the lift pins 189 raise the substrates in the cassette 1030. A bottom region 105 of the processing apparatus 100 is defined between the floor 134 and the cassette 1030.

A first shaft 126 of the first support frame 199, a second shaft 125 of the second support frame 198, and a section 151 of the lower window 115 extend through a port formed in a bottom 135 of the chamber body 130 and the floor 134. As described below, each shaft 125, 126 is coupled to one or more respective motors, which are configured to independently raise, lower, and/or rotate the cassette 1030 using the first support frame 199, and to independently raise and lower the lift pins 189 using the second support frame 198. The first support frame 199 includes the first shaft 126 and a plurality of first arms 1021 configured to support the cassette 1030 that includes one or more substrate supports 212. The second support frame 198 includes the second shaft 125 and a plurality of second arms 1022 configured to interface with and support the lift pins 189.

An opening 136 (a substrate transfer opening) is formed through the one or more sidewalls of the chamber body 130. The opening 136 may be used to transfer the substrates 107 to or from the cassette 1030, e.g., in and out of the processing volume 124. In one or more embodiments, the opening 136 includes a slit valve. In one or more embodiments, the opening 136 may be connected to any suitable valve that enables the passage of substrates therethrough. The opening 136 is shown in ghost in FIGS. 1 and 2 for visual clarity purposes.

The processing apparatus 100 may include one or more temperature sensors 191, 192, 195, such as optical pyrometers, which measure temperatures within the processing apparatus 100 (such as on the surfaces of the upper window 116, and/or one or more surfaces of the substrates 107, the heat shield structure 1060, and/or the cassette 1030). The one or more temperature sensors 191, 192 are disposed on the lid 104. The one or more temperature sensors 195 (e.g., lower pyrometers) are disposed on a lower side of the lower window 115. The one or more temperature sensors 195 can be disposed adjacent to and/or on the bottom 135 of the chamber body 130.

In one or more embodiments, upper temperature sensors 191, 192 are oriented toward a top of the cassette 1030. In one or more embodiments, side temperature sensors 131 are oriented toward the first shield plate 161 and/or substrate supports 212 of the cassette 1030. In one or more embodiments, lower temperature sensors 195 are oriented toward a bottom of the cassette 1030.

The processing apparatus 100 includes a controller 1070 configured to control the processing apparatus 100 or components thereof. For example, the controller 1070 may control the operation of components of the processing apparatus 100 using a direct control of the components or by controlling controllers associated with the components. In operation, the controller 1070 enables data collection and feedback from the respective chambers to coordinate and control performance of the processing apparatus 100.

The controller 1070 generally includes a central processing unit (CPU) 1071, a memory 1072, and support circuits 1073. The CPU 1071 may be one of any form of a general purpose processor that can be used in an industrial setting. The memory 1072, or non-transitory computer readable medium, is accessible by the CPU 1071 and may be one or more of memory such as random access memory (RAM), read only memory (ROM), floppy disk, hard disk, or any other form of digital storage, local or remote. The support circuits 1073 are coupled to the CPU 1071 and may include cache, clock circuits, input/output subsystems, power supplies, and the like.

The various methods (such as the method 500) and operations disclosed herein may generally be implemented under the control of the CPU 1071 by the CPU 1071 executing computer instruction code stored in the memory 1072 (or in memory of a particular processing chamber) as, e.g., a software routine. When the computer instruction code is executed by the CPU 1071, the CPU 1071 controls the components of the processing apparatus 100 to conduct operations in accordance with the various methods and operations described herein. In one embodiment, which can be combined with other embodiments, the memory 1072 (a non-transitory computer readable medium) includes instructions stored therein that, when executed, cause the methods (such as the method 500) and operations (such as the operations 510, 520, 530, 540, 550, 560) described herein to be conducted. The controller 1070 can be in communication with the heat sources, the gas sources, and/or the vacuum pump(s) of the processing apparatus 100, for example, to cause a plurality of operations to be conducted. The controller 1070 can control the lift assembly 200 described below. The controller 1070 can control, for example, the motors 340, 370 described below to conduct at least part of the method 400.

FIG. 1B is a schematic cross-sectional side view of the processing apparatus 100 shown in FIG. 1A, according to one embodiment. The cross-sectional view shown in FIG. 1B is rotated by 55 degrees relative to the cross-sectional view shown in FIG. 1A.

The processing apparatus 100 includes one or more side heat sources 118a, 118b (e.g., side lamps, side resistive heaters, side LEDs, and/or side lasers, for example) positioned outwardly of the processing volume 124. One or more second side heat sources 118b are opposite one or more first side heat sources 118a across the processing volume 124.

In FIG. 1B, the flow guide structure 150 and the heat shield structure 1060 are not shown for visual clarity purposes. Additionally, the present disclosure contemplates that the flow guide structure 150 and/or the heat shield structure 1060 can be omitted from the processing apparatus 100 shown in FIGS. 1-2. In such an embodiment, the one or more process gases P1 flow into an outer annulus of the processing volume 124 from the gas inject passages 182, and then flow into openings 216 between and outwardly of substrate supports 212 (e.g., arcuate supports) of the cassette 1030, and then into gaps between the substrates 107. The one or more process gases P1 flow out of the gaps, into the openings 216 (between and outwardly of substrate supports) on an exhaust side of the substrates 107, into the outer annulus of the processing volume 124, and into the one or more gas exhaust passages 172. The present disclosure also contemplates that a plurality of lines (such as conduits) in the processing volume 124 can connect each of the gas inject passages 182 to each of the inlet openings of the cassette 1030.

In addition to the one or more temperature sensors 191, 192 positioned above the processing volume 124 and above the second shield plate 1062, the processing apparatus 100 may include one or more temperature sensors 131, such as optical pyrometers, which measure temperatures within the processing apparatus 100 (such as on the surfaces of the upper window 116 and/or one or more surfaces of the substrates 107, the heat shield structure 1060, a plurality of windows 157, and/or the cassette 1030). The plurality of windows 157—if used—can be disposed in gaps between or formed in the one or more liners 120. The one or more temperature sensors 131 are side temperature sensors (e.g., side pyrometers) that are positioned outwardly of the processing volume 124, outwardly of the flow guide structure 150, and outwardly of the plurality of windows 157. The one or more temperature sensors 131 can be radially aligned, for example, with the plurality of windows 157 (as shown in FIG. 1B).

The one or more side temperature sensors 131 (such as one or more pyrometers) can be used to measure temperatures within the processing volume 124 from respective sides of the processing volume 124. The side sensors 131 are arranged in a plurality of sensor levels (three sensor levels are shown in FIG. 1B). In one or more embodiments, the number of sensor levels is equal to the number of heat source levels. Each side sensor 131 can be oriented horizontally or can be directed (e.g., oriented downwardly at an angle) toward the substrate 107 and the substrate support 212 of a respective level of the cassette 1030.

Figure 2:
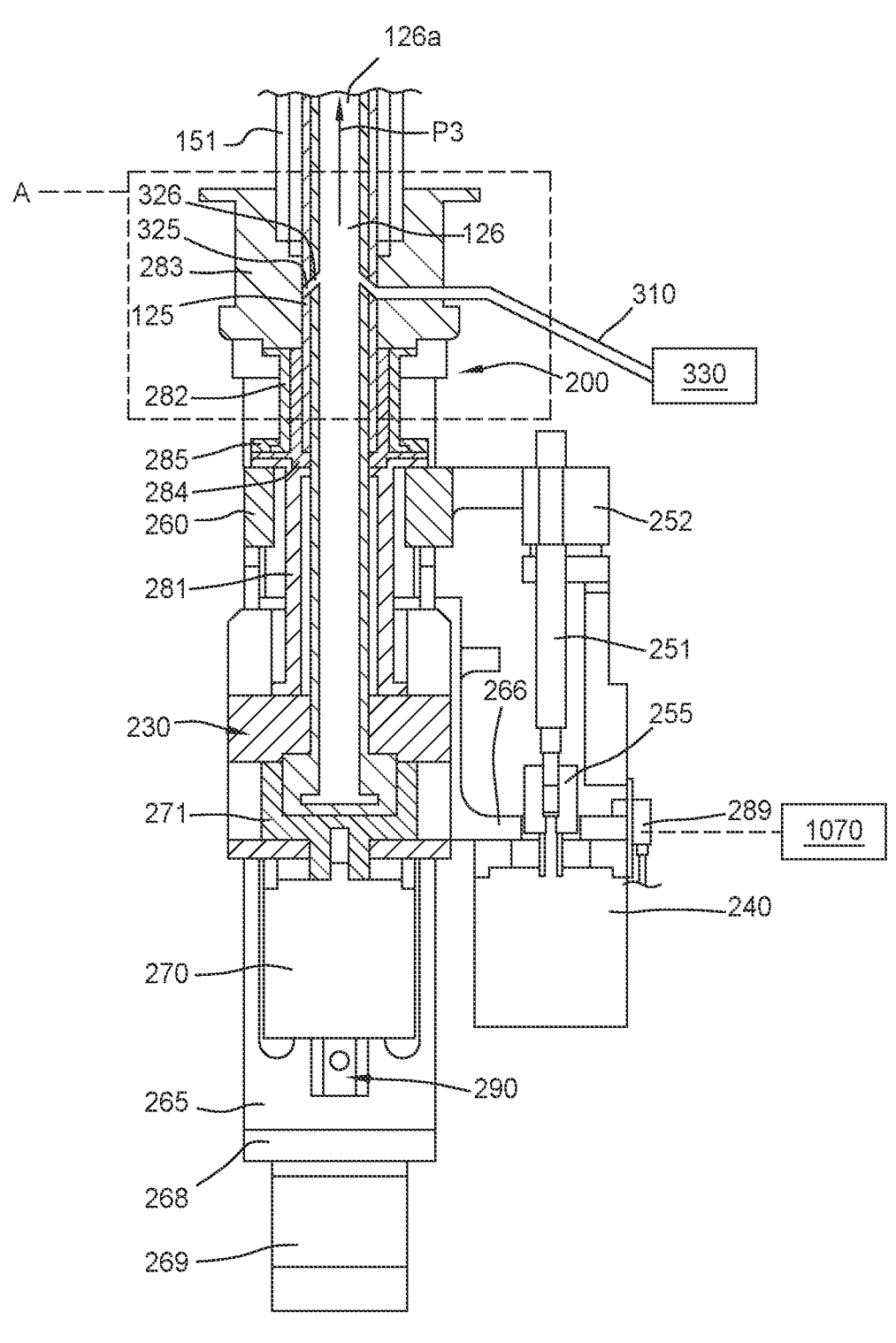
FIG. 2 is partial schematic side cross-sectional view of a lift assembly, according to one embodiment.

FIG. 2 is a partial schematic side cross-sectional view of a lift assembly 200, according to one embodiment. Hatching is not shown for some components for visual clarity purposes.

The lift assembly 200 is coupled the processing apparatus 100. For example, as shown in FIG. 2, the lift assembly 200 is coupled to the first shaft 126, the second shaft 125, and/or the section 151 of the lower window 115.

The lift assembly 200 includes a first motor 240. The first motor 240 is configured to linearly move the second support block 260. A first drive shaft 251 is coupled to the first motor 240, and a second traveling block 252 is disposed along the first drive shaft 251. The second traveling block 252 is coupled to the second support block 260 and is configured to linearly move along the first drive shaft 251. The first motor 240 is configured to rotate the first drive shaft 251 to move the second traveling block 252 such that the second support block 260 moves with the second traveling block 252. In one or more embodiments, the first drive shaft 251 is a second lead screw, and a second threaded interface is between the second lead screw and the second traveling block 252 such that rotation of the first drive shaft 251 linearly moves the second traveling block 252 along the first drive shaft 251.

The lift assembly 200 includes a support beam 265, and a mount block 266 coupled to the support beam 265. The first motor 240 is coupled to the mount block 266.

The support beam 265 is coupled to a base block 268, and the base block 268 is coupled to a base frame 269. The base frame 269 mounts the lift assembly 200 to a structure. For example, the base frame 269 can coupled to a mainframe of a cluster tool.

The lift assembly 200 includes a second motor 270 coupled to the first support block 230. In one or more embodiments, the second motor 270 linearly moves with the linear movement of the first support block 230.

The first support block 230 supports the first shaft 126 of the first support frame 199 such that linear movement of the first support block 230 linearly moves the first support frame 199 to raise and/or lower the first support frame 199. In one or more embodiments, the first shaft 126 is coupled to the first support block 230 (e.g., using fasteners and/or interference fitting of overlapping shoulders). In the embodiment shown in FIG. 2, the first shaft 126 includes an inner rod 226a and an outer rod 226b. Each rod 226a, 226b can be integrally formed, or can include one or more components coupled together. Each shaft 125, 126 can be integrally formed, or can include one or more components coupled together.

The second support block 260 supports the second shaft 125. Linear movement of the second traveling block 252 (which is driven by the first motor 240 rotating the first drive shaft 251) linearly moves the second support block 260. The first motor 240 is configured to linearly move (e.g., raise and/or lower) the second traveling block 252 and the second support block 260. In one or more embodiments, the second shaft 125 is coupled to the second support block 260 (e.g., using fasteners and/or interference fitting of overlapping shoulders).

The second motor 270 is configured to rotate the first shaft 126 of the first support frame 199 using a rotor 271 coupled to the first shaft 126. The rotor 271 and the first shaft 126 are configured to rotate within and relative to the first support block 230. The second motor 270 can rotate the first support frame 199 during a deposition operation, such as an epitaxial deposition operation.

Each motor 240, 270 can include, for example, an electric motor, such as a servo motor. Other motors are contemplated for each motor 240, 270. The first motor 240 can each be a rotary motor or a linear motor. The second motor 270 can be a rotary motor.

The lift assembly 200 includes one or more position sensors 289 that are configured to measure the vertical position of the first support frame 199 and/or the second support frame across a plurality of positions. The, plurality of positions can include, for example, the processing position, the transfer position, and a rotation initiation position for the first support frame 199. The one or more position sensors 289 are in communication with the controller 220. When the one or more position sensors detect the rotation initiation position of the first support frame 199, the controller 220 automatically instructs the second motor 270 to begin rotating the first support frame 199 (and the cassette 1030). The rotation initiation position is vertically between the processing position and the transfer position such that the first support frame 199 passes the rotation initiation position while raising from the transfer position and toward the processing position. The plurality of positions can include a home position between the rotation initiation position and the transfer position.

A first seal sleeve 281 is disposed between the first support block 230 and the second support block 260, and a second seal sleeve 282 is disposed between the second support block 260 and an end flange 283 of the lift assembly 200. The second shaft 125 interfaces with a shoulder of a support ring 284. A clamp ring 285 couples the support ring 284, the first seal sleeve 281, and the second seal sleeve 282 to the second support block 260. The clamp ring 285 can be fastened to the second support block 260 using one or more fasteners. Each of the first seal sleeve 281 and the second seal sleeve 282 can include a bellows, such as a bellows formed of a metallic material or a metallized material.

Figure 3A:
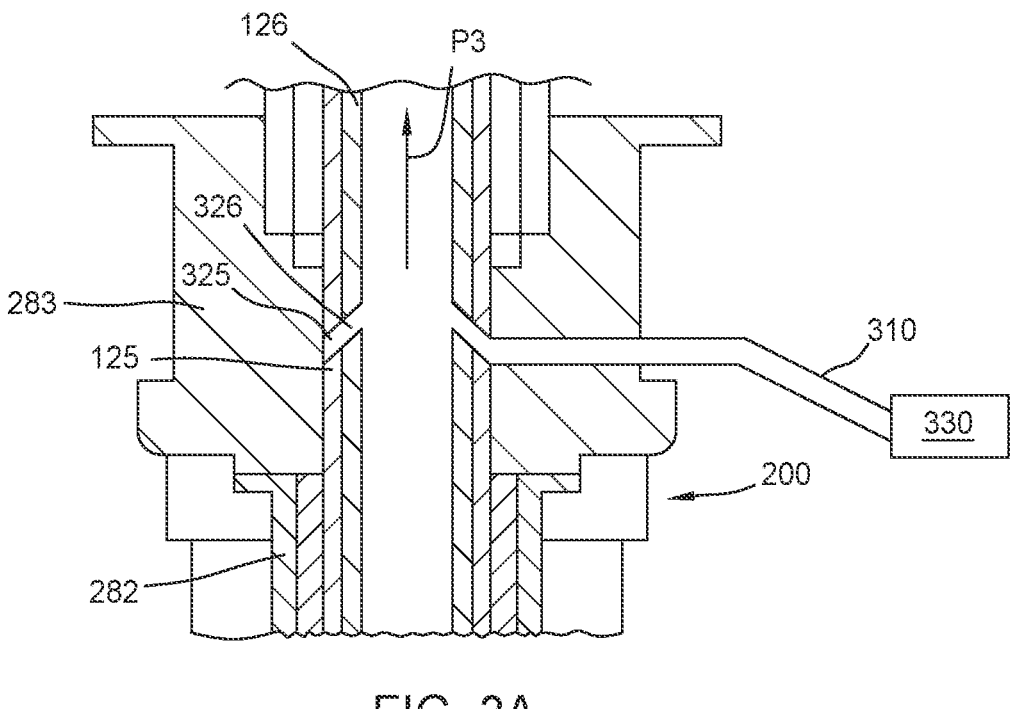
FIGS. 3A-3B are enlarged views of the partial schematic side cross-sectional view of the lift assembly shown in FIG. 2, according to one embodiment.
Figure 3B:
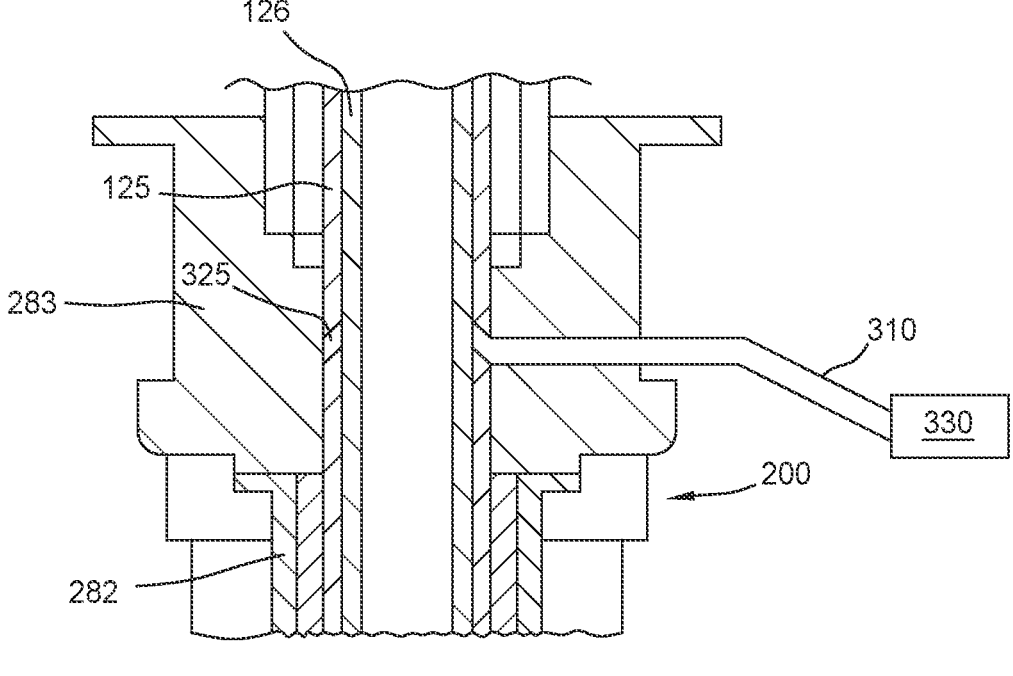

FIGS. 3A-3B are enlarged views of box A in FIG. 2 illustrating a partial schematic side cross-sectional view of the lift assembly 200, according to one embodiment.

The first shaft 126 has a perforation 326 and the second shaft 125 has a perforation 325. When the first shaft 126 rotates, the perforation 326 aligns with the perforation 325 in the second shaft 125. A lift assembly gas source 330 is connected to a gas piping 310. When the perforations 325, 326 are aligned, gasses from the lift assembly gas source 330 travel up the first shaft 126 into the processing apparatus 100. The gas flows through the first shaft 126 and contacts the underside of the lowermost substrate 107. The gas is then exhausted through the gas exhaust passages 172. An illustration of the aligned perforations 325, 326 is shown in FIG. 3A. Because the perforations 325, 326 are aligned, cleaning gas P3 is able to flow through the first shaft 126 towards the underside of the lowermost substrate 107. Further rotation of the first shaft 126 results in the perforations 325, 326 becoming unaligned, as shown in FIG. 3B. Since the perforations 325, 326 are unaligned, cleaning gas P3 is blocked by the solid portion of the first shaft 126, and is unable to flow towards the underside of the lowermost substrate 107.

The perforations 325, 326 align and unalign when the first shaft 126 rotates within the second shaft 125. Different rotation speeds may affect the flowrate of the cleaning gas into the processing apparatus 100. It is contemplated that the first shaft 126 may be rotated to a position within the second shaft 125 and held at that position such that a constant stream of cleaning gas may be supplied to the processing apparatus 100. Similarly, it is contemplated that the first shaft 126 may be rotated to a position within the second shaft 125 and held at that position such that there is no flow of cleaning gas from the lift assembly gas source 330 to the processing apparatus 100.

In FIGS. 3A-3B, the gas piping 310 is connected to the lift assembly 200 through an end flange 283. It is contemplated that the gas piping 310 may be connected at a different locations on the lift assembly 200. The gas piping 310 is shown as entering a single side of the lift assembly 200 in FIGS. 3A-3B. However, it is contemplated that the gas piping 310 may enter a plurality of locations within the lift assembly 200. In some embodiments, the gas piping 310 may be permanent piping or semi-permanent commercially available piping. In some embodiments, the gas piping 310 may be flexible to accommodate for movement in the lift assembly 200.

The perforations 325, 326 may be any regular or irregular shape. The perforations may be sized smaller or larger based on the desired flowrate and velocity of gas into the processing apparatus 100. In one embodiment which may be combined with other embodiments, the perforations 325, 326 may range from 2 mm to 6.35 mm.

Figure 4A:
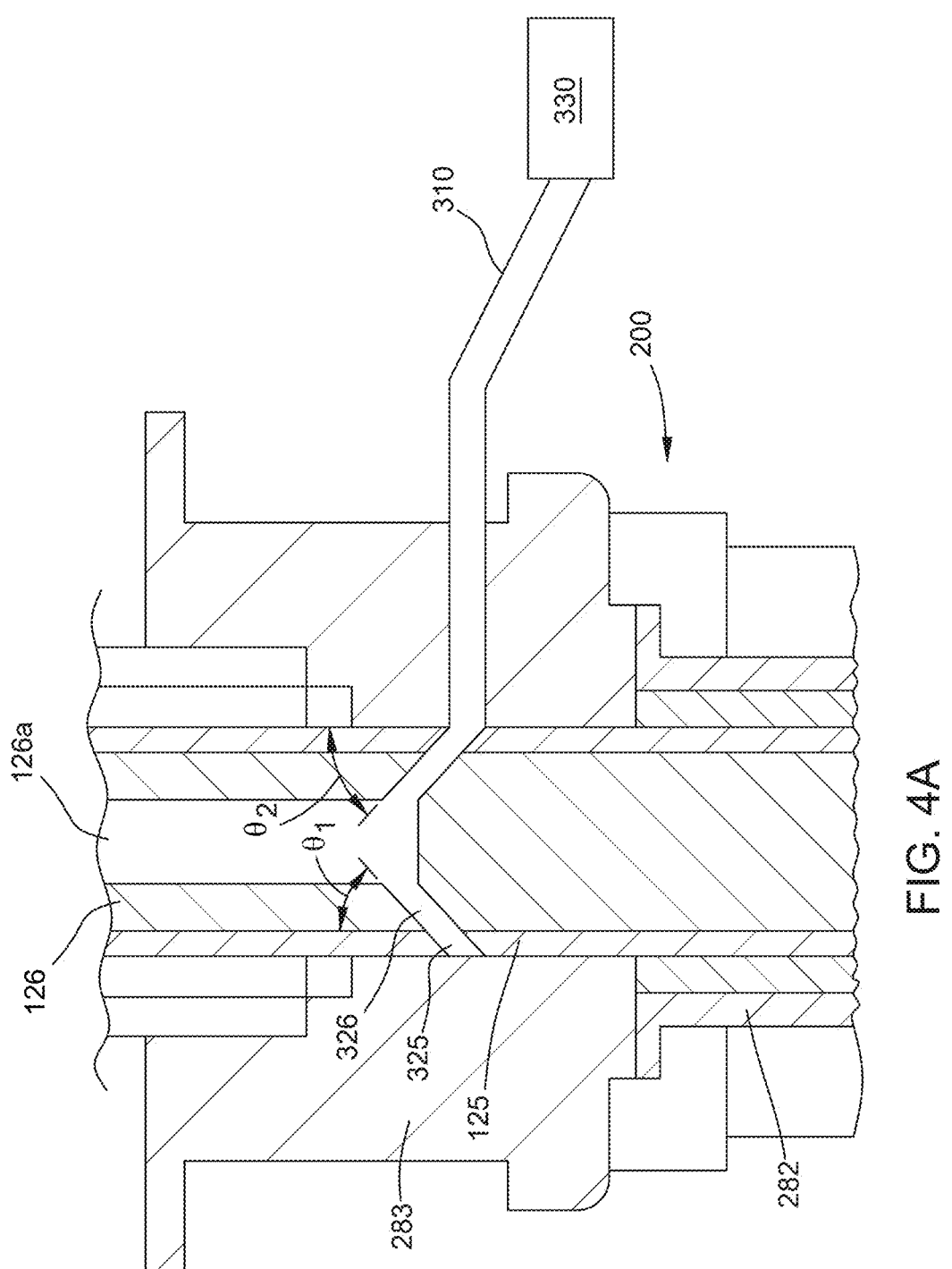
FIGS. 4A-4B are enlarged views of the partial schematic side cross-sectional view of the lift assembly shown in FIG. 2, according to one embodiment.

The perforations 325, 326 are each at an angle $\Theta_1$, $\Theta_2$, where the angle is formed between the perforation 325, 326 and the first and second shafts 125, 126 (See FIG. 4A). The first perforation 326 is at a first angle $\Theta_1$ relative to a surface of the first shaft 126. The second perforation 325 is at a second angle $\Theta_2$ relative to a surface of the second shaft 125. The angles $\Theta_1$, $\Theta_2$ may range from zero to ninety degrees, or in a range from thirty to sixty degrees, to direct the gases into the processing chamber. In one embodiment, the angles $\Theta_1$, $\Theta_2$ of the perforations 325, 326 are 45 degrees.

Although only two perforations 325, 326 are shown in FIGS. 3A-3B, it is contemplated that a plurality of perforations 325, 326 may be located along the circumference of the first and second shafts 125, 126. More perforations 325, 326 may be utilized to introduce more gas into the processing apparatus 100. It is also contemplated that the first and second shafts 125, 126 may each have a single perforation 325, 326. Fewer perforations 325, 326 may be utilized to increase the structural integrity of the first and second shafts or to decrease the amount of gas introduced into the processing apparatus 100. The plurality of perforations 325, 326 may be spaced regularly or irregularly on the circumferences of the first and second shafts 125, 126. In one implementation, the plurality of perforations 325, 326 includes four perforations 325 positioned along the circumference of the first shaft 126 and four perforations 326 positioned along the circumference of the second shaft 125. Additionally, it is contemplated that a plurality of perforations 325, 326 may be located vertically along the first and second shafts 125, 126. A plurality of vertical perforations 325, 326 may be utilized to accommodate for the linear movement in the first shaft 126.

Figure 4B:
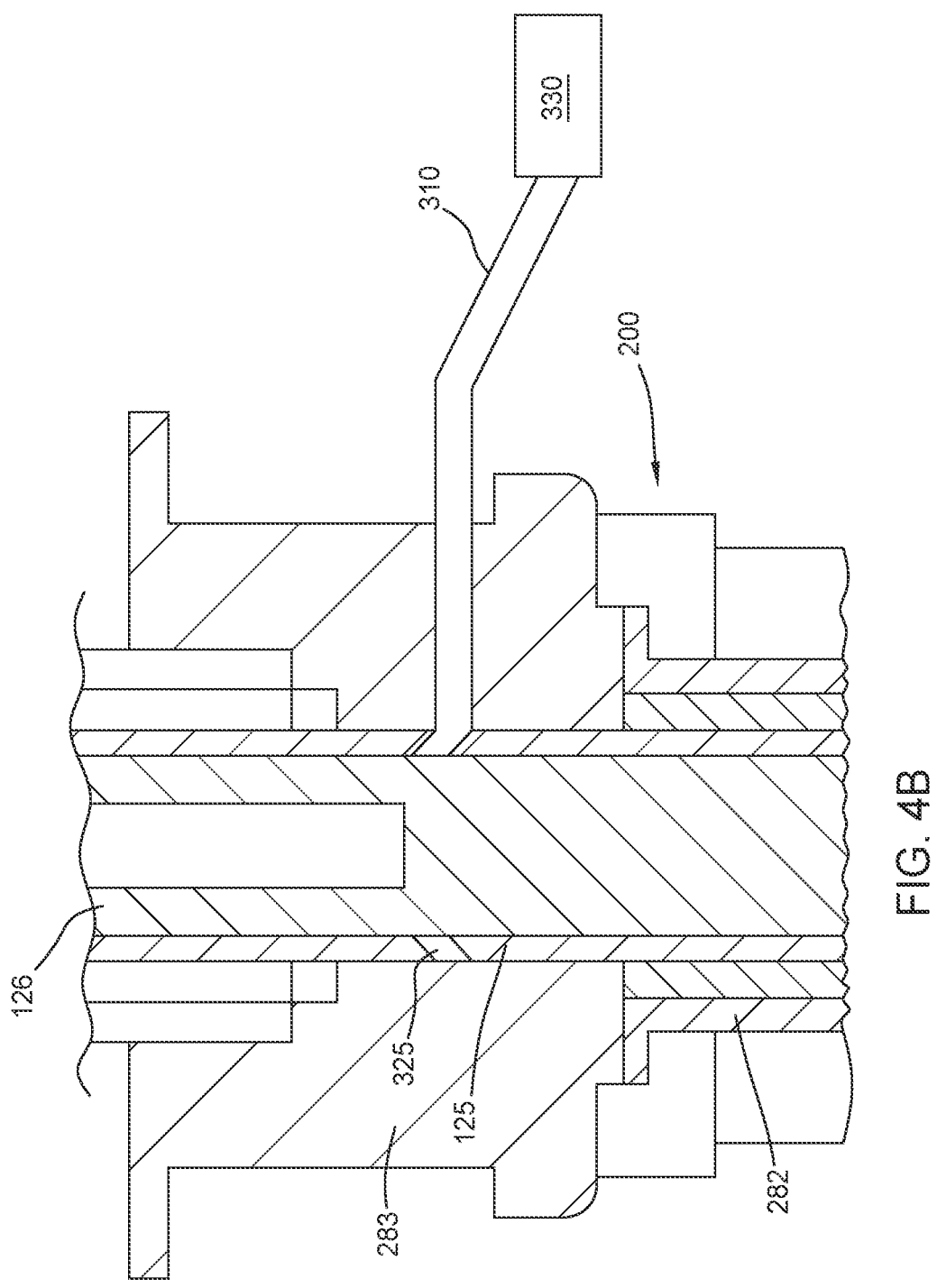

In FIG. 2 and FIGS. 3A-3B, the first shaft 126 is shown as completely hollow. However, it is contemplated that a portion of the first shaft 126 is hollow, and a portion is solid, for example, as is shown in FIGS. 4A-4B. In one embodiment, the portion of the first shaft 126 below the second perforation 326 is solid, and the portion of the first shaft 126 above the second perforation 326 is hollow.

The lift assembly gas source 330 supplies a cleaning gas. The cleaning gas may include an etching gas, a purge gas, or a combination of etching gas and purge gas. The lift assembly gas source 330 is configured to supply a cleaning gas to the gas piping 310 which is connected to the perforation 325. The cleaning gas can include an etching gas, a purge gas, or a combination of an etching gas and a purge gas. The etching gas may be HCl or $Cl_2$. The purge gas may include one or more of argon (Ar), helium (He), nitrogen ($N_2$), hydrogen chloride (HCl), and/or hydrogen ($H_2$).

FIGS. 4A-4B are enlarged views of the partial schematic side cross-sectional view of the lift assembly 200 shown in FIG. 2, according to one embodiment. Aspects of the lift assembly 200 as shown in FIGS. 4A-4B may be combined with aspects of the lift assembly 200 as shown in FIGS. 3A-3B.

In FIGS. 4A-4B, the first shaft 126 is largely solid with the exception of the perforations 326 and a hollow center 126a leading up to the processing apparatus 100. The perforations 326 extend through the sold portion of the first shaft 126 into the hollow center 126a. In FIGS. 4A-4B, the hollow center 126a has a lowest point that aligns with the perforations 326. It is contemplated that the hollow center 126a may extend lower than the perforations 326.

It is contemplated that the diameter of the hollow center 126a may be larger or smaller than what is shown in FIG. 4A.

An illustration of the aligned perforations 325, 326 is shown in FIG. 4A. Because the perforations 325, 326 are aligned, cleaning gas P3 is able to flow through the first shaft 126 towards the processing apparatus 100. Further rotation of the first shaft 126 results in the perforations 325, 326 becoming unaligned, as shown in FIG. 4B. Since the perforations 325, 326 are unaligned, cleaning gas P3 is blocked by the solid portion of the first shaft 126, and is unable to flow towards the processing apparatus 100.

Figure 5:
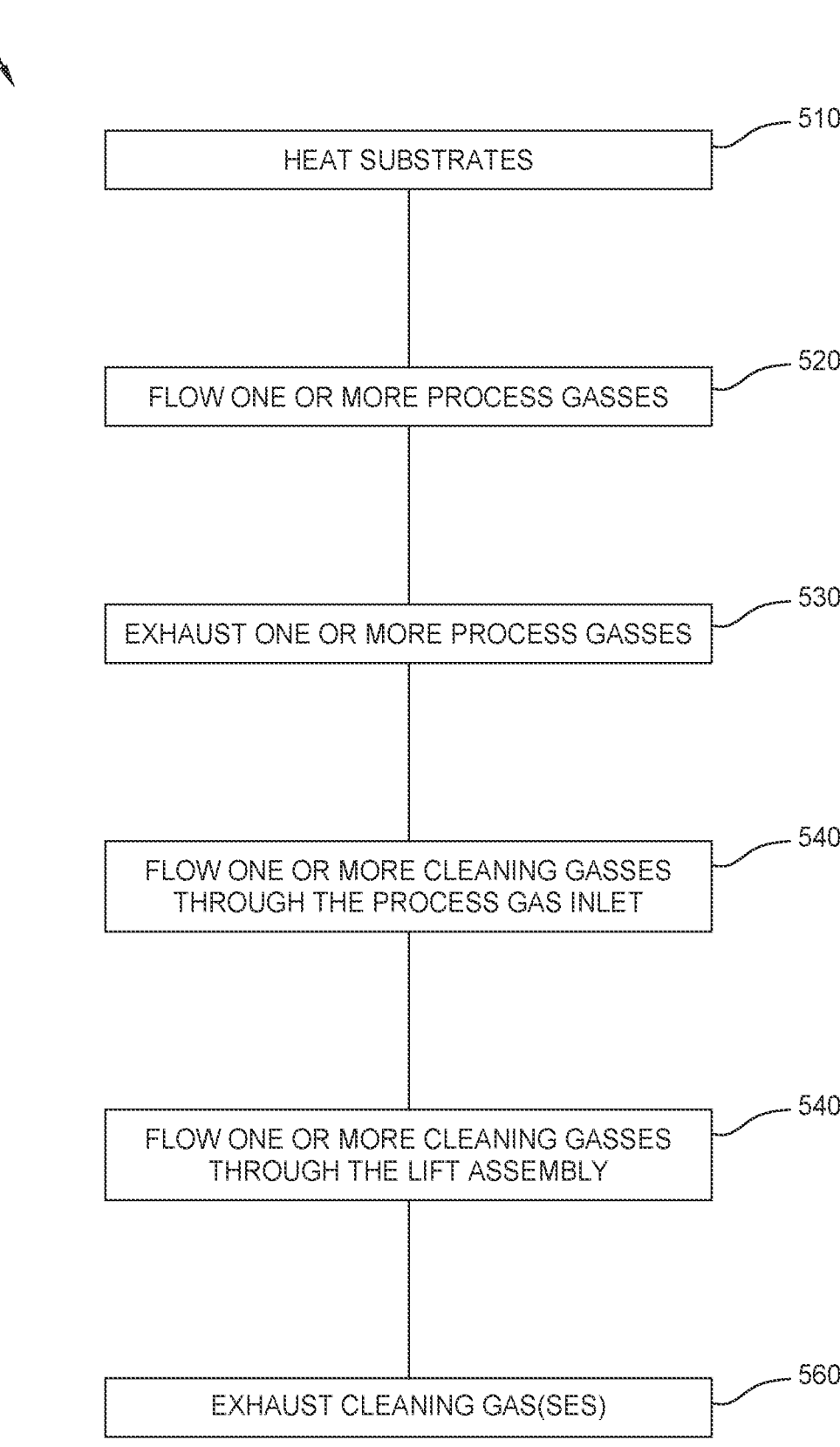
FIG. 5 is a flowchart illustrating a method of processing substrates, according to one embodiment.

FIG. 5 is a flowchart illustrating a method 500 of processing substrates, according to one embodiment. The method 500 may be performed using the processing apparatus 100.

Operation 510 includes heating substrates within a cassette positioned on a substrate support, for example, the cassette 1030 positioned on the substrate support assembly 119. Operation 510 may be performed prior to, simultaneously with, or after operation 520, operation 530, operation 540, operation 550, and/or operation 560.

Operation 520 includes flowing one or more process gases over the substrates in the cassette to form one or more layers on the substrates, for example, the substrates 107. Operation 520 may be performed prior to, simultaneously with, or after operation 510, operation 530, operation 540, operation 550, and/or operation 560. In one embodiment, which can be combined with other embodiments, the one or more process gases are supplied to a processing volume, for example, the processing volume 124, at a pressure that is 300 Torr or greater, such as within a range of 300 Torr to 600 Torr. In one embodiment, which can be combined with other embodiments, the one or more process gases are supplied at a flow rate that is less than 5,000 standard cubic centimeters per minute (SCCM). In one embodiment, which can be combined with other embodiments, the substrates are rotated at a rotation speed that is less than 8 rotations-per-minute (RPM) during the flowing of the one or more process gases over the substrates. In one example, which can be combined with other examples, the rotation speed is 1 RPM.

Operation 530 includes exhausting the one or more process gases through an exhaust outlet formed at least partially in a sidewall, for example, the exhaust conduit system 190. Operation 530 may be performed prior to, simultaneously with, or after operation 510, operation 520, operation 540, operation 550, and/or operation 560.

Operation 540 includes flowing of the one or more cleaning gases through the process gas inlet. Operation 540 may be performed prior to, simultaneously with, or after operation 510, operation 520, operation 530, operation 550, and/or operation 560. The one or more cleaning gases may comprise an etchant gas, a purge gas, or a mixture of both.

Operation 550 includes flowing of the one or more cleaning gases through the lift assembly, for example, the lift assembly 200. Operation 550 may be performed prior to, simultaneously with, or after operation 510, operation 520, operation 530, operation 540, and/or operation 560. The one or more cleaning gases may comprise a cleaning gas, a purge gas, or a mixture of both. The one or more cleaning gases are piped to the lift assembly, through the first shaft, and onto the underside of the lowermost substrate. The rotation of the first shaft allows flow of the cleaning gas into the processing chamber by aligning the perforation of the first and second shafts. Flowing the one or more cleaning gases through the lift assembly in operation 550 and through the process gas inlet in operation 540 may occur simultaneously, in a periodic rotation, partially overlapping, or sequentially with either operation 540 or 550 going first. Additionally, flowing the one or more cleaning gases through the lift assembly in operation 550 and the flowing one or more process gasses over the substrates may occur simultaneously, in a periodic rotation, partially overlapping, or sequentially with either operation 530 or 550 going first.

Operation 560 includes exhausting the one or more cleaning gases through the exhaust path. Operation 560 may be performed prior to, simultaneously with, or after operation 510, operation 520, operation 530, operation 540, and/or operation 550. Operation 560 may be a continuous process or an intermittent process. The cleaning gases may be exhausted in operation 560 while the cleaning gases are introduced in operations 540, 550. In other embodiments, operations 540, 550 may run for a period before exhausting the cleaning gases begins in operation 560. In other embodiments, operations 540, 550 may run to completion prior to starting operation 560.

While the foregoing is directed to embodiments of the present disclosure, other and further embodiments of the disclosure may be devised without departing from the basic scope thereof, and the scope thereof is determined by the claims that follow.

The invention claimed is:

1. An apparatus applicable for use in semiconductor manufacturing, comprising:
   a first shaft having a first perforation;
   a second shaft having a second perforation, wherein at least a portion of the first shaft is disposed inside of the second shaft and the first shaft is rotatable with respect to the second shaft;
   a support frame coupled to an end of the first shaft, the support frame comprising a plurality of arms; and
   a cassette disposed above the support frame, the plurality of arms being coupled to the cassette to support the cassette such that lifting and lowering the support frame lifts and lowers the cassette, wherein the first perforation and the second perforation are configured to allow passage of a gas through the first perforation and the second perforation when the first shaft is rotated, wherein the first shaft is configured such that the gas is flowable through an interior of the first shaft to contact an underside of a substrate disposed on the cassette.

2. The apparatus of claim 1, wherein the first perforation is a first plurality of perforations and the second perforation is a second plurality of perforations, wherein at least one of the first plurality of perforations and at least one of the second plurality of perforations are configured to allow the gas into the interior of the first shaft.

3. The apparatus of claim 1, wherein the first perforation is at a first angle relative to a surface of the first shaft and the second perforation are at a second angle relative to a surface of the second shaft, wherein the first angle and the second angle are between 0° and 90°.

4. The apparatus of claim 1, further comprising a connection between the second perforation and a gas source.

5. The apparatus of claim 4, wherein the connection is permanent piping or semi-permanent piping.

6. A method of processing substrates applicable for use in semiconductor manufacturing, comprising:
   rotating a first shaft having a first perforation wherein at least a part of the first shaft is disposed within a second shaft, wherein a support frame coupled to an end of the first shaft, the support frame comprising a plurality of arms and a cassette disposed above the support frame, the plurality of arms being coupled to the cassette to support the cassette such that lifting and lowering the support frame lifts and lowers the cassette;
   flowing a gas through a piping, wherein the piping is coupled to a second perforation in the second shaft;
   flowing the gas through the second perforation and the first perforation into an interior of the first shaft; and
   flowing the gas from the interior of the first shaft to an underside of a substrate disposed within a processing chamber.

7. The method of claim 6, wherein the substrate is disposed on a cassette.

8. The method of claim 6, wherein the first perforation is a first plurality of perforations and the second perforation is a second plurality of perforations, wherein at least one of the first plurality of perforations and at least one of the second plurality of perforations are configured to allow the gas into the interior of the first shaft.

9. The method of claim 6, wherein the gas is a cleaning gas, a purge gas, or a combination thereof.

10. The method of claim 6, further comprising flowing a second gas through a process gas inlet.

11. The method of claim 10, wherein the second gas is a cleaning gas.

12. The method of claim 11, wherein the flowing the second gas occurs after the flowing the gas through the interior of the first shaft to the underside of the substrate is completed.

13. The method of claim 6, further comprising exhausting the gas through an exhaust outlet.

14. A method of processing substrates applicable for use in semiconductor manufacturing, comprising:
   heating a substrate positioned above a substrate support;
   flowing one or more process gases over the substrate to form one or more layers on the substrate;
   rotating a first shaft having a first perforation wherein at least a part of the first shaft is disposed within a second shaft, wherein a support frame coupled to an end of the first shaft, the support frame comprising a plurality of arms and a cassette disposed above the support frame, the plurality of arms being coupled to the cassette to support the cassette such that lifting and lowering the support frame lifts and lowers the cassette;
   flowing a cleaning gas through a connection, wherein the connection is coupled to a second perforation in the second shaft;
   flowing the cleaning gas through the second perforation and the first perforation into an interior of the first shaft; and
   flowing the cleaning gas from the interior of the first shaft to an underside of a substrate disposed within a processing chamber.

15. The method of claim 14, wherein the substrate is disposed on a cassette and the cassette is disposed on the substrate support.

16. The method of claim 14, wherein the first perforation is a first plurality of perforations and the second perforation is a second plurality of perforations, wherein at least one of the first plurality of perforations and at least one of the second plurality of perforations are configured to allow the cleaning gas into the interior of the first shaft.

17. The method of claim 14, wherein the cleaning gas is an etchant gas, a purge gas, or a combination thereof.

18. The method of claim 14, wherein at least a part of the flowing the one or more process gases is completed prior to the flowing the cleaning gas through the connection.

19. The method of claim 14, wherein the flowing the one or more process gases is completed prior to the flowing the cleaning gas through the connection.

20. The method of claim 14, further comprising exhausting the cleaning gas through an exhaust outlet.

\* \* \* \* \*